United States Patent [19]

Rodder

[11] Patent Number: 5,100,816
[45] Date of Patent: Mar. 31, 1992

[54] METHOD OF FORMING A FIELD EFFECT TRANSISTOR ON THE SURFACE OF A SUBSTRATE

[75] Inventor: Mark S. Rodder, Dallas, Tex.
[73] Assignee: Texas Instruments Incorporated, Dallas, Tex.
[21] Appl. No.: 556,232
[22] Filed: Jul. 20, 1990
[51] Int. Cl.$^5$ .................................. H01L 21/265
[52] U.S. Cl. .................................. 437/40; 437/41; 437/44; 437/190; 357/23.7
[58] Field of Search ............... 437/40, 41, 44, 190, 437/3; 357/23.7

[56] References Cited

U.S. PATENT DOCUMENTS

| | | | |
|---|---|---|---|
| 4,704,783 | 10/1987 | Posin et al. | 437/40 |
| 4,821,092 | 4/1989 | Noguchi | 375/23.7 |
| 4,882,295 | 11/1989 | Czubatyj et al. | 357/23.7 |
| 4,931,353 | 6/1990 | Tanielian | 437/140 |
| 4,933,296 | 6/1990 | Paris et al. | 437/40 |
| 4,945,067 | 7/1990 | Huang | 437/44 |
| 4,956,680 | 9/1990 | Tanaka et al. | 357/23.7 |
| 4,968,638 | 11/1990 | Wright et al. | 437/41 |
| 4,988,631 | 1/1991 | Ogawa | 437/3 |

OTHER PUBLICATIONS

Tanaka, "Characteristics of Offset-Structure Polycrystalline-Silicon Thin-Film Transistors", IEEE, vol. 9, No. 1, 1/88.

*Primary Examiner*—Brian E. Hearn
*Assistant Examiner*—Kevin M. Picardat
*Attorney, Agent, or Firm*—James C. Kesterson; B. Peter Barndt; Richard L. Donaldson

[57] ABSTRACT

A transistor is disclosed which comprises a gate conductor 34 insulated from a channel region 55 by a gate insulator layer 38. A spacer insulator block 46 is used to accurately space a drain region 52 a predetermined distance from the gate conductor 34. A dopant source body 48 is used to form the drain region 52 such that the formation of the drain region 52 is a self-aligned process. According to the teachings of the present invention, the drain region 52 can be accurately spaced from the gate conductor 34 to reduced field enhanced leakage current during the operation of the transistor.

8 Claims, 1 Drawing Sheet

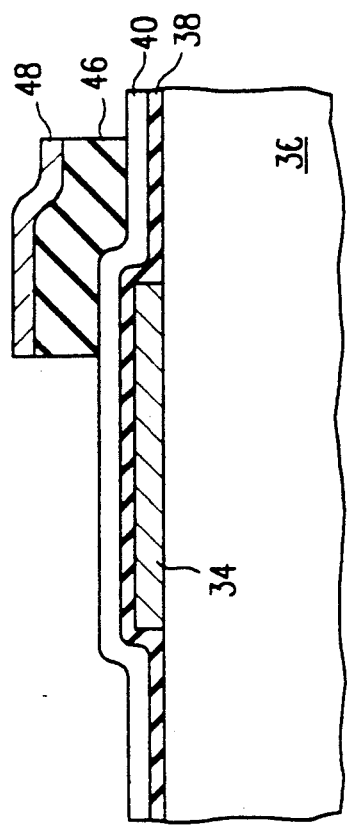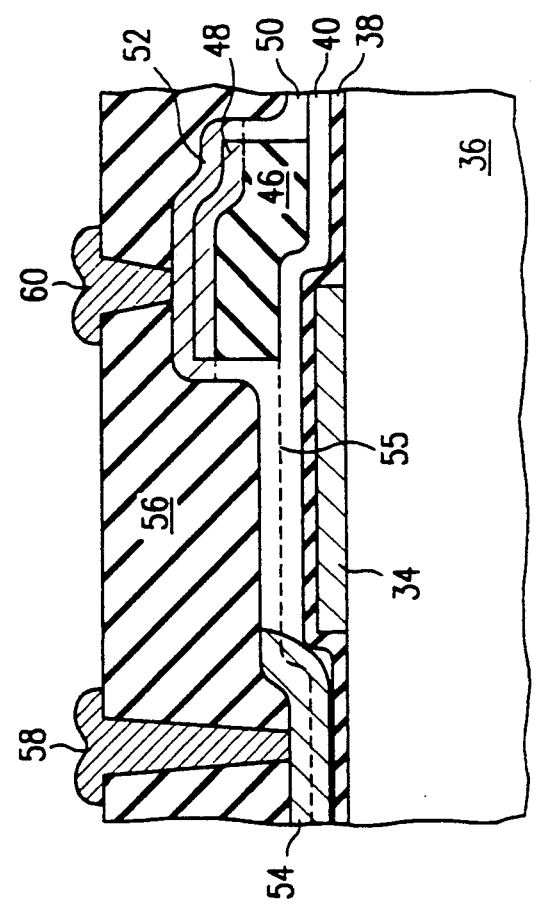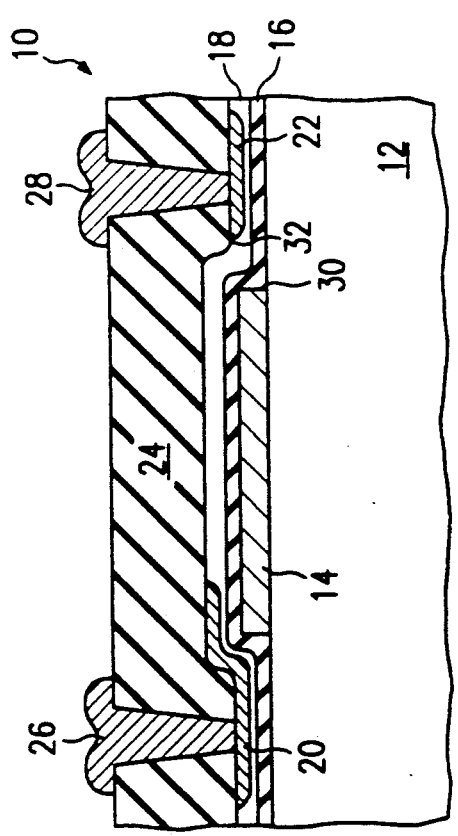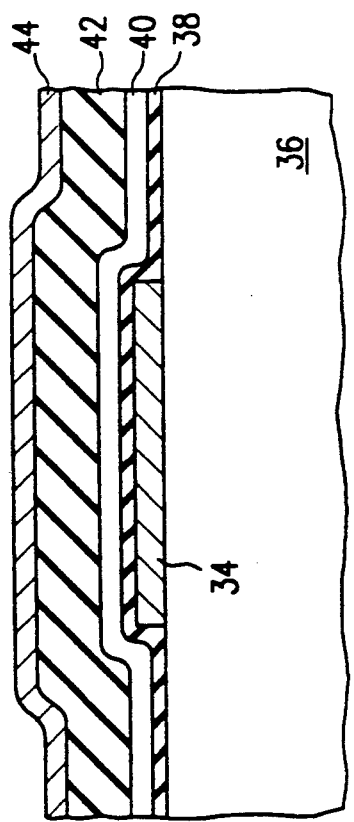
FIG. 1 (PRIOR ART)
FIG. 2a
FIG. 2b
FIG. 2c

METHOD OF FORMING A FIELD EFFECT TRANSISTOR ON THE SURFACE OF A SUBSTRATE

TECHNICAL FIELD OF THE INVENTION

This invention relates in general to the field of electronic devices and more specifically, to an improved transistor and method for forming the same.

BACKGROUND OF THE INVENTION

The field effect transistor forms the building block of many modern digital integrated electronic devices. In order to increase the active device density of electronic devices, thin film transistors have been developed which provide adequate transfer characteristics but do not require the use of bulk single-crystal semiconductor material. A thin film field effect transistor may use polycrystalline, amorphous, partially recrystallized, or completely recrystallized semiconductor material comprising its channel. One form of thin film field effect transistor is the bottom gated transistor which comprises a gate conductor formed inwardly from the channel layer. Bottom gated thin film transistors may be used in high density stacked SRAM cells as well as other applications. In these applications, it is desired that the thin film transistors have high drive current and low leakage current.

One of the most important considerations in achieving high drive current with low leakage current is the field enhanced leakage current around the drain region of thin film transistor architectures. During the operation of a thin film field effect transistor device, a large electric field is generated between the drain region and the gate conductor resulting in an unacceptably high leakage current. In order to limit the detrimental effects of this high electric field, transistor architectures have attempted to incorporate spacing between the drain region and the gate conductor to reduce the magnitude of the field between these two regions. These architectures have met with limited success due to the problems of alignment tolerances associated with such architectures.

Accordingly, a need has arisen for a thin film field effect transistor architecture which reduces the field enhanced leakage current associated with the drain of the device but which uses easily controlled processes to provide a high yield architecture.

SUMMARY OF THE INVENTION

In accordance with the present invention, a field effect transistor architecture is provided which substantially eliminates or reduces disadvantages and problems associated with prior art transistor architectures. More specifically, the present invention discloses a transistor which may be formed on a surface of a substrate. A gate conductor is formed on an outer surface of the substrate and a channel layer is insulatively disposed outwardly from the gate conductor. A spacer insulator block is disposed between the gate conductor and the drain region of the channel layer. The thickness of the spacer insulator block may be accurately controlled to control the electric field formed between the drain region and the gate conductor of the device.

An important technical advantage of the present invention inheres in the fact that the formation of the spacer insulator block allows for the self-aligned formation of the drain region a predetermined distance from the gate conductor. The width of the spacer insulator block can be accurately controlled such that the space between the drain region and the gate conductor can be exactly specified using a self-aligned process. In this manner, the field enhanced leakage currents can be controlled without resorting to processes subject to misalignment.

BRIEF DESCRIPTION OF THE DRAWINGS

A more complete understanding of the present invention may be acquired by referring to the detailed description and claims when considered in connection with the accompanying drawings, wherein:

FIG. 1 is an elevational cross-sectional diagram of a prior art transistor architecture; and FIGS. 2a through 2c are elevational cross-sectional diagrams illustrating the method of constructing the transistor of the present invention.

DETAILED DESCRIPTION OF THE INVENTION

FIG. 1 is a cross-sectional elevational diagram of a prior art transistor architecture which is indicated generally at 10. Transistor 10 is formed on a substrate 12. Transistor 10 comprises a gate conductor 14 formed on an outer surface of substrate 12. A gate oxide layer 16 is formed outwardly from gate conductor 14. A channel layer 18 is formed outwardly from gate conductor layer 16. A source region 20 and a drain region 22 are disposed in channel layer 18 and comprise regions of channel layer 18 into which impurities have been introduced to make regions 20 and 22 highly conductive. An isolation insulator layer 24 covers the entire structure of transistor 10. A source contact 26 and a drain contact 28 pass through isolation insulator layer 24 and contact source region 20 and drain region 22, respectively.

The composition of transistor 10 comprises materials known in the art to manufacture bottom gated thin film field effect transistor devices. For example, substrate 12 may comprise an insulative material such as oxide. Further, substrate 12 may comprise other active devices in an integrated electronic system. This is due to the fact that thin film transistors do not require single-crystal semiconductor material for their operation. Accordingly, thin film transistors may be formed in stacked configurations. Accordingly, it should be understood that while the transistor of the present invention and the transistor shown in FIG. 1 are illustrated as being constructed on the outer surface of a substrate 12, these transistors could be constructed in the midst of other active devices as long as the transistor is suitably electronically insulated from the other devices.

Gate conductor 14 may comprise, for example, polycrystalline, amorphous, partially recrystallized, or wholly recrystallized silicon doped so as to be rendered conductive. Gate insulator 16 may comprise, for example, silicon dioxide or other suitable insulator material. Channel layer 18 may comprise polycrystalline, amorphous, partially recrystallized, or wholly recrystallized semiconductor material such as silicon. Isolation insulator layer 24 may comprise, for example, oxide. Source and drain contacts 26 and 28 may comprise any suitable conductor such as metal or semiconductor material which has been doped so as to be rendered conductive.

The considerations addressed by the transistor architecture of the present invention are illustrated in the cross sectional diagram of FIG. 1. During the operation of transistor 10, a high electric field will exist in or near the region between an edge 30 of gate conductor 14 and an edge 32 of drain region 22. This high electric field can result in leakage current which then flows between source 26 and drain 28. In order to reduce this leakage current, it is desirable to space edge 32 a predetermined distance away from edge 30. Unfortunately, the placement of drain region 22 within channel layer 18 is dependent upon the alignment of the implantation step used to form source region 20 and drain region 22. The accuracy of the placement of edge 32 with respect to edge 30 is limited by the accuracy of the photolithographic and implantation processes used to form drain region 22. Conventional photolithographic processes can result in alignment errors which can be detrimental to the transfer characteristics of the transistor being constructed. For example, if edge 32 is placed too closely to edge 30, a high electric field and a corresponding high leakage current will result during the operation of transistor 10. On the other hand, if edge 32 is placed too far from edge 30, the resistance of the portion of channel layer 18 between edge 32 and edge 30 will increase the channel resistance of transistor 10 thereby reducing the drive current available from transistor 10.

Accordingly, the placement of edge 32 with respect to edge 30 in transistor 10 is critical in the minimization of the leakage current and the channel resistance associated with transistor 10. Unfortunately, conventional photolithographic techniques do not provide the necessary precision for the accurate placement of the drain region boundary with respect to the gate conductor in these devices.

It should be noted that the placement of the source region 20 with respect to gate conductor 14 is not nearly as critical as that of the drain region 22. As shown in FIG. 1, the source region 20 can significantly overlap the gate conductor 14 without significant leakage current developing. This is due to the low electric fields associated with the source end of field effect transistors.

FIGS. 2a through 2c are cross-sectional diagrams which illustrate the process steps necessary to form a field effect transistor according to the teachings of the present invention. Referring to FIG. 2a, a gate conductor 34 may be formed on an outer surface of a substrate 36. Gate conductor 34 may comprise any suitable conductor such as metal or semiconductor material which has been doped so as to be rendered conductive. Further, gate conductor 34 could comprise an implanted region of substrate 36. According to this embodiment, substrate 36 may comprise a semiconductor material into which impurities are introduced to form a conductive region comprising gate conductor 34.

A gate insulator layer 38 is formed covering gate conductor 34. Gate insulator layer 38 may comprise, for example, a layer of oxide on the order of 100 to 500 angstroms in thickness. A first partial channel layer 40 is formed covering gate insulator layer 38. First partial channel layer 40 may comprise, for example, partially or wholly recrystallized semiconductor material, polycrystalline semiconductor material, or amorphous semiconductor material. Partial channel layer 40 may be on the order of 200 to 1,000 angstroms in thickness.

A spacer insulator layer 42 is formed covering first partial channel layer 40. Spacer insulator layer 42 may comprise a layer of silicon dioxide on the order of 500 to 5000 angstroms in thickness. As will be described more completely herein, the thickness of spacer insulator layer 42 in part determines the spacing between the drain region and the gate conductor of the transistor of the present invention. As described previously, this spacing is critical to prevent field enhanced leakage current within the transistor. The thickness of spacer insulator layer 42 can be controlled with great precision using controlled deposition or oxidation processes.

A dopant source layer 44 is deposited covering spacer insulator layer 42. Dopant source layer 44 may comprise, for example, semiconductor material which is in-situ doped or doped with diffused or implanted impurities. For example, dopant source layer 42 can be subjected to a low energy, high dose implantation procedure of, for example, boron difluoride at an energy of 10 KeV and a density of $1E14/cm^2$.

Referring to FIG. 2b, portions of the spacer insulator layer 42 and the dopant source layer 44 are removed using conventional photolithographic and selective etching processes to leave spacer insulator block 46 and dopant source body 48. This procedure can be accomplished using conventional anisotropic etchant processes which are selective to the semiconductor material comprising first partial channel layer 40.

Referring to FIG. 2c, the completed transistor architecture is illustrated. A second partial channel layer 50 is deposited covering first partial channel layer 40, spacer insulator block 46 and dopant source body 48. Second partial channel layer 50 may comprise a second layer of amorphous, polycrystalline, partially recrystallized or wholly recrystallized semiconductor material having a thickness on the order of 200 to 1000 angstroms.

An annealing step is then used to allow the dopants within dopant source body 48 to diffuse into second partial channel layer 50 to form a drain region 52. Through the use of this annealing procedure, the formation of drain region 52 is a self-aligned process. Accordingly, the spacing between the edge of drain region 52 and the gate conductor 34 can be accurately controlled. This spacing is determined by the thickness of spacer insulator block 46 and is not subject to misalignment problems associated with prior art structures.

A source region 54 may be implanted using conventional implantation procedures. The alignment of source region 54 with respect to gate conductor 34 is not as critical as the alignment of drain region 52 with respect to gate conductor 34. However, if a particular application required a symmetrical device, a similar spacer insulator block could be formed on the source end of the transistor of the present invention. According to this embodiment, the spacing between the source region and the gate conductor could be accurately controlled as well using the same self-aligned annealing process.

A conventional implantation procedure may be used, if necessary, to implant impurities into a channel region 55 between source region 54 and drain region 52. This implantation step can be used to adjust the resistivity of channel region 55 to alter the characteristics of the finished transistor. After any necessary implantation procedure, an isolation insulator layer 56 is deposited over the entire structure. Isolation insulator layer 56 may comprise a relatively thick layer of oxide. Openings are created through isolation insulator layer 56 using conventional photolithographic techniques and a source contact 58 and a drain contact 60 are formed through the openings. Source contact 58 is conductively coupled to source region 54 and drain contact 60 is conductively coupled to drain region 52. Contacts 58 and 60 may comprise any suitable conductor such as metal or semiconductor material which has been doped so as to be rendered conductive. Contact is also made to gate conductor 34. This gate contact is not shown in the cross-sectional diagram but may be made using conventional processes elsewhere in the circuit. The gate contact may similarly comprise a suitable conductor such as metal or semiconductor material which has been doped so as to be rendered conductive.

The use of the spacer insulator block 46 and the dopant source body 48 allow for the self-aligned formation of drain region 52 and the very accurate spacing of the drain region 52 with respect to the gate conductor 34. The critical spacing between the drain region 52 and the gate conductor 34 is determined by the thickness of the spacer insulator block 46. This thickness can be very accurately controlled during the formation of spacer insulator layer 42. Accordingly, a transistor constructed according to the teachings of the present invention is not subject to the misalignment problems associated with prior art structures which attempt to space the drain region away from the gate conductor using conventional implantation procedures.

Although the present invention has been described in detail, it should be understood that various changes, substitutions and alterations can be made hereto without departing from the spirit and scope of the invention as defined by the appended claims.

What is claimed is:

1. A method for forming a transistor, comprising the steps of:
    forming a gate conductor;
    forming a gate insulator adjacent the gate conductor;
    forming a spacer insulator block having a selected thickness adjacent the gate insulator;
    forming a channel layer having first, second and third portions, the first portion formed adjacent the gate insulator layer and separated from the gate conductor by the gate insulator, the second portion formed adjacent the spacer insulator block and separated from the gate insulator layer by the spacer insulator block, the third portion formed adjacent the spacer insulator and joining said first and second portions, the channel layer comprising a semiconductor material;
    forming a drain region in the second portion of the channel layer, the thickness of the spacer insulator block determining the length of the shortest path through the first and third portions of the channel layer between the drain region and the gate insulator.

2. The method of claim 1 and further comprising the step of forming a dopant source body adjacent the spacer insulator block and the second portion of the channel layer, said step of forming a drain region comprising the step of heating the dopant source body and the second portion of the channel layer such that impurities within the dopant source body diffuse into portions of the second portion of the channel layer adjacent the dopant source body.

3. The method of claim 1 and further comprising the step of forming a source region in the channel layer spaced apart from the drain region such that the gate conductor is operable to electrically actuate the channel layer between the source and drain regions.

4. The method of claim 1 wherein said step of forming a gate conductor comprises the step of forming the gate conductor on a surface of a substrate.

5. The method of claim 1 wherein said step of forming a channel layer comprises the step of forming a channel layer comprising a material selected from the group consisting of polycrystalline semiconductor material, amorphous semiconductor material, partially recrystallized semiconductor material, and wholly recrystallized semiconductor material.

6. A method for forming a transistor on a surface of a substrate, comprising the steps of:
    forming a gate conductor disposed on the surface;
    forming a gate insulator layer, a portion of said gate insulator layer adjacent the gate conductor and separated from the surface by the gate conductor;
    forming a first partial channel layer adjacent the gate insulator layer and separated from the gate conductor by the gate insulator layer;
    forming a spacer insulator block adjacent the first partial channel layer and separated from the gate insulator layer by the first partial channel layer;
    forming a dopant source body adjacent the spacer insulator block and separated from the first partial channel layer by the spacer insulator block;
    forming a second partial channel layer having first, second and third portions, the first portion adjacent the first partial channel layer and separated from the gate insulator layer by the first partial channel layer, the second portion adjacent the spacer insulator block, the third portion adjacent the dopant source body and separated from the spacer insulator block by the dopant source body, the first and second partial channel layers comprising a semiconductor material; and
    forming a drain region disposed in the third portion of the second partial channel layer.

7. The method of claim 6 and further comprising the step of forming a source region in the first portion of the second partial channel layer spaced apart from the drain region, the gate conductor operable to electrically actuate the first and second partial channel layers between the source and drain regions.

8. The method of claim 6 wherein said step of forming a drain region comprises the step of heating the dopant source body and the third portion of the channel layer such that impurities within the dopant source body diffuse into portions of the third portion of the channel layer adjacent the dopant source body.

* * * * *